(12) United States Patent
Tan

(10) Patent No.: US 11,156,870 B2
(45) Date of Patent: Oct. 26, 2021

(54) LENS AND MANUFACTURING METHOD THEREOF, BACKLIGHT PANEL AND DISPLAY DEVICE

(71) Applicant: BOE TECHNOLOGY GROUP CO., LTD., Beijing (CN)

(72) Inventor: Jifeng Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 887 days.

(21) Appl. No.: 15/736,944

(22) PCT Filed: May 8, 2017

(86) PCT No.: PCT/CN2017/083420
§ 371 (c)(1),
(2) Date: Dec. 15, 2017

(87) PCT Pub. No.: WO2018/120573
PCT Pub. Date: Jul. 5, 2018

(65) Prior Publication Data
US 2018/0364524 A1 Dec. 20, 2018

(30) Foreign Application Priority Data
Dec. 26, 2016 (CN) .......................... 201611217500.6

(51) Int. Cl.
*G02B 19/00* (2006.01)
*G02B 3/00* (2006.01)
(Continued)

(52) U.S. Cl.
CPC ..... *G02F 1/133606* (2013.01); *G02B 3/0056* (2013.01); *G02B 19/0028* (2013.01);
(Continued)

(58) Field of Classification Search
CPC ......... G02F 1/133603; G02F 1/133607; G02B 3/08; G02B 19/066; G02B 19/0028; G02B 5/1876; F21V 5/045
See application file for complete search history.

(56) References Cited

U.S. PATENT DOCUMENTS

2015/0276146 A1* 10/2015 Wu ........................... F21V 5/04
362/235
2018/0143355 A1* 5/2018 Hu ........................... G02B 3/10

FOREIGN PATENT DOCUMENTS

CN    101561114 A    10/2009
CN    101990614 A    3/2011
(Continued)

OTHER PUBLICATIONS

First Office Action for Chinese Patent Application No. 2016112175000.6 dated Nov. 24, 2017.
(Continued)

*Primary Examiner* — Angela K Davison
(74) *Attorney, Agent, or Firm* — Calfee, Halter & Griswold LLP

(57) ABSTRACT

The embodiments of the invention provide a lens and a manufacturing method thereof, a backlight panel and a display device, which improve the collimation of the light beam emitted from the light source and improve the utilization ratio of light energy. The lens includes: a light exit surface; a first light entrance surface opposite to the light exit surface; a second light entrance surface surrounding the first light entrance surface and located on a side of the first light entrance surface facing away from the light exit surface; and a bowl-shaped free curved surface surrounding the second light entrance surface and opposite to the light exit surface. The light exit surface, the first light entrance surface, the (Continued)

second light entrance surface and the bowl-shaped free curved surface enclose the lens.

15 Claims, 4 Drawing Sheets

(51) Int. Cl.
    *G02F 1/13357*      (2006.01)
    *G02F 1/29*      (2006.01)
    *H01L 33/58*      (2010.01)
    *G02F 1/1335*      (2006.01)

(52) U.S. Cl.
    CPC ... *G02B 19/0066* (2013.01); *G02F 1/133603* (2013.01); *G02F 1/29* (2013.01); *G02B 2003/0093* (2013.01); *G02F 1/133607* (2021.01); *H01L 33/58* (2013.01); *H01L 2933/0058* (2013.01)

(56) References Cited

FOREIGN PATENT DOCUMENTS

| | | |
|---|---|---|
| CN | 201837773 U | 5/2011 |
| CN | 102262262 A | 11/2011 |
| CN | 104180208 A | 12/2014 |
| CN | 204227312 U | 3/2015 |
| CN | 104777696 A | 7/2015 |
| CN | 105785567 A | 7/2016 |
| CN | 106443846 A | 2/2017 |
| JP | 2011085741 A | 4/2011 |

OTHER PUBLICATIONS

Search Report for International Application No. PCT/CN2017/083420 dated Aug. 4, 2017.

\* cited by examiner

LENS AND MANUFACTURING METHOD THEREOF, BACKLIGHT PANEL AND DISPLAY DEVICE

RELATED APPLICATIONS

The present application is the U.S. national phase entry of the international application PCT/CN2017/083420, with an international filing date of Sep. 8, 2017, which claims the benefit of Chinese Patent Application No. 201611217500.6, filed on Dec. 26, 2016, the entire disclosures of which are incorporated herein by reference.

TECHNICAL FIELD

The present invention relates to the field of display technology, in particular to a lens and manufacturing method thereof, a backlight panel, and a display device.

BACKGROUND

Compared with traditional light sources, semiconductor light sources such as OLEDs have the advantages of energy saving, environmental protection, long service life, fast response, etc. The development, research and production of OLED lighting products and display devices have become a sunrise industry with broad development prospects. Compared with the traditional light sources, light emitted by OLEDs is approximately of Lambert type, which cannot be directly used in current lighting or display systems.

Moreover, with the rapid development of various types of display devices in recent years, the utilization ratio of light energy has drawn more and more attention. For light emitted by the current LCD and OLED displays, the range of viewing angle in space is relatively large, only a small part of the light can thus be received by the human eye, greatly reducing the utilization ratio of light energy.

SUMMARY

To this end, the embodiments of the invention provide a lens and manufacturing method thereof, a backlight panel, and a display device, which improve the collimation of the light beam emitted from the light source and improve the utilization ratio of light energy.

According to an aspect of the invention, an embodiment of the invention provides a lens. The lens includes: a light exit surface; a first light entrance surface opposite to the light exit surface; a second light entrance surface surrounding the first light entrance surface and located on a side of the first light entrance surface facing away from the light exit surface; and a bowl-shaped free curved surface surrounding the second light entrance surface and opposite to the light exit surface; the light exit surface, the first light entrance surface, the second light entrance surface and the bowl-shaped free curved surface enclose the lens.

The lens provided by the embodiment of the invention utilizes the first light entrance surface and the second light entrance surface to form a groove, and a light source such as an OLED can be disposed in the groove or in the vicinity of the groove. For a light source such as an OLED, light with a small emission angle can be transmitted through the first light entrance surface and exits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. In applications of display devices such as LCDs and OLEDs, the use of a collimated light beam can control the display orientation of the display device well, thereby not only achieving a better display effect, but also reducing energy consumption and saving maintenance costs.

In certain exemplary embodiments, the light exit surface is planar.

Using a planar light exit surface is beneficial for simplifying the design of the first light entrance surface, the second light entrance surface and the bowl-shaped free curved surface. Compared with a light exit surface with a complex shape, the lens provided by the embodiment of the invention can also be implemented by a simple manufacturing process. For example, the light exit surface can be used as a bottom surface, and the lens can be manufactured by a process such as lithography, imprinting, laser ablation or electron beam direct writing (EBD).

However, the light exit surface can also be a curved surface such as a convex surface. In this case, the lens can be formed using an injection molding process; for example, the first light entrance surface, the second light entrance surface and bowl-shaped free curved surface can be formed first by a process such as lithography, imprinting, laser ablation or electron beam direct writing, and then the light exit surface is formed.

In certain exemplary embodiments, the first light entrance surface has a convex surface.

In this embodiment, with a first light entrance surface in the form of a convex lens, light of a small emission angle can be further collimated so that the exit beam has a smaller divergence angle.

In certain exemplary embodiments, the shape of the bowl-shaped free curved surface is determined by the following recurrence relations:

$$\begin{cases} (x_{i+1} - y_{i+1})N_{xi} + (y_{i+1} - y_i)N_{yi} = 0 \\ \dfrac{x_i - r}{K_i + \sin \theta_i} = \dfrac{y_i - r \cot \theta_i}{\cos \theta_i} \\ N_{x_i} = -(K_i + \sin \theta_i) \\ N_{y_i} = n - \cos \theta_i \\ K_i = \sqrt{n^2 - \cos^2 \theta_i} - \sin \theta_i \end{cases}$$

where $(x_i, y_i)$ and $(N_{xi}, N_{yi})$ are respectively coordinates of a point on the bowl-shaped free curved surface corresponding to a light beam with an incident angle $\theta_i$ and a normal vector at the point; r is a distance between the second light entrance surface and an origin; and n is a refractive index of a material of the lens.

According to the above recurrence relation of $(x_i, y_i)$ and $(x_{i+1}, y_{i+1})$ the design of the lens can be simplified and optimized. Different N values can be used to obtain bowl-shaped free curved surfaces and collimation effects with different accuracies.

In certain exemplary embodiments, a material of the lens is a transparent organic material.

For example, a transparent polymer material such as PMMA, resin, etc. can be used to manufacture the lens of the embodiment of the invention.

According to another aspect of the invention, an embodiment of the invention provides a method for manufacturing the lens described in the above embodiment. The method includes the following steps: providing a substrate, the substrate including a first substrate surface and a second substrate surface opposite to the first substrate surface; disposing the first substrate surface as the light exit surface; forming the first light entrance surface, the second light entrance surface, and the bowl-shaped free curved surface on the second substrate surface by at least one process of lithography, imprinting, laser ablation and electron beam direct writing.

The first light entrance surface, the second light entrance surface, and the bowl-shaped free curved surface can be formed on the second substrate surface by a process of lithography, imprinting, laser ablation or electron beam direct writing, a part of the substrate is thus formed as the lens. With such a process, lenses or array of lenses as described in embodiments of the invention can be conveniently formed directly on the substrate.

According to yet another aspect of the invention, an embodiment of the invention provides a backlight panel. The backlight panel includes: a light source substrate; a plurality of light sources disposed on the light source substrate; and a plurality of lenses as described in the above embodiments; each of the lenses corresponds to one of the plurality of light sources.

The lens provided by the embodiment of the invention utilizes the first light entrance surface and the second light entrance surface to form a groove, and a light source such as an OLED can be disposed in the groove or in the vicinity of the groove. For a light source such as an OLED, light with a small emission angle can be transmitted through the first light entrance surface and exits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. Furthermore, arranging the plurality of light sources on the light source substrate can conveniently form modular structures that adapt to various display devices or lighting devices.

In certain exemplary embodiments, the backlight panel further includes a substrate, and the plurality of lenses are integrally formed on the substrate.

The first light entrance surface, the second light entrance surface, and the bowl-shaped free curved surface can be formed on one surface of the substrate by a process of lithography, imprinting, laser ablation or electron beam direct writing, a part of the substrate is thus formed as the lens. With such a process, lenses or array of lenses as described in embodiments of the invention can be conveniently formed directly on the substrate.

In certain exemplary embodiments, the backlight panel further includes a filling material disposed between the plurality of lenses, and the refractive index of the filling material is lower than the refractive index of the lens.

By applying the filling material with the lower refractive index, it can be ensured that light with a large emission angle realizes total internal reflection on the bowl-shaped free curved surface, thereby further increasing the utilization ratio of light.

According to still another aspect of the invention, an embodiment of the invention provides a display device. The display device includes a backlight panel as described in the above embodiments and a liquid crystal display panel disposed on a light exit side of the backlight panel.

The lens provided by the embodiment of the present invention utilizes the first light entrance surface and the second light entrance surface to form a groove, and a light source such as an OLED can be disposed in the groove or in the vicinity of the groove. For a light source such as an OLED, light with a small emission angle can be transmitted through the first light entrance surface and emits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. In applications of display devices such as LCDs and OLEDs, the use of a collimated light beam can control the display orientation of the display device well, thereby not only achieving a better display effect, but also reducing energy consumption and saving maintenance costs.

In certain exemplary embodiments, the display device further includes a light control panel disposed between the backlight panel and the liquid crystal display panel. The light control panel includes: a controllable liquid crystal lens; a first polarizer located on a light entrance side of the controllable liquid crystal lens; a determining unit for determining a light exit direction of the light control panel; and a control unit for controlling a liquid crystal tilt angle of the controllable liquid crystal lens based on the light exit direction determined by the determining unit, thereby redirecting light into the determined light exit direction.

The light control panel of the embodiment of the invention can change the tilt angle of the liquid crystal of the liquid crystal layer, e.g. in a voltage control mode, and cooperate with the polarizer to redirect the light beam into the direction determined by the light control panel.

In certain exemplary embodiments, the control unit adjusts the electric field in one or more subregions in each region of the controllable liquid crystal lens based on the determined light exit direction, thereby adjusting the tilt angle of the liquid crystal in the subregions.

In certain exemplary embodiments, the determining unit further includes a user location collecting module for collecting current location information of a user; the determining unit determines the light exit direction of the light control panel based on the current location information of the user collected by the user location collecting module.

When the position of the user in front of the light control panel changes, for example, from directly in front of the light control panel to the left front of the light control panel, the image sensing unit of the light control panel such as the camera senses the position change of the user and collects the location information after the user moves, for example, the image sensing unit of the light control panel collects the location information of the user's eye and transmits the location information to the processing unit of the light control panel, so that the processing unit determines the light exit direction of the light control panel.

In certain exemplary embodiments, the determining unit further includes a light intensity collecting module for collecting light intensity information of ambient environment; the determining unit determines the light exit direction of the light control panel based on the light intensity information collected by the light intensity collecting module.

When the ambient light intensity of the light control panel changes e.g. from large to small (i.e., the brightness decreases), the light sensing unit of the light control panel, such as a light intensity sensor or a brightness sensor, senses the current ambient change and collects light information of darkening, and then sends the information to the processing unit of the light control panel so that the processing unit determines the direction of the light path after passing through the liquid crystal lens. The light beam is thus more divergent after the light beam passes through the light control panel, thereby reducing the visual brightness. In addition, if the light intensity changes from small to large (i.e., the brightness increases), the light sensing unit senses the current ambient changes and collects light information of brightening, and then sends the information to the processing unit of light control panel so that the processing unit determines the light exit direction of the light control panel.

DETAILED DESCRIPTION OF THE INVENTION

In the following, the technical solutions in the embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Figure 1:
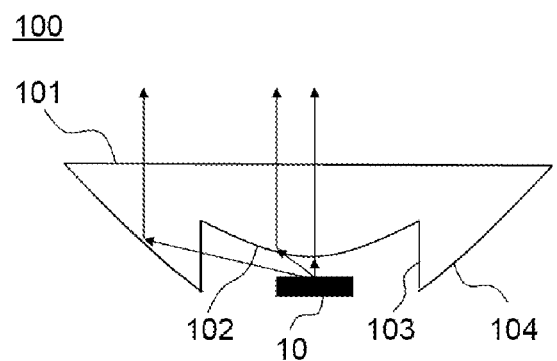
FIG. 1 is a cross section diagram of a lens according to an embodiment of the invention.

According to an aspect of the invention, an embodiment of the invention provides a lens. FIG. 1 is a cross section diagram of a lens according to an embodiment of the invention. The lens 100 includes: a light exit surface 101; a first light entrance surface 102 opposite to the light exit surface 101; a second light entrance surface 103 surrounding the first light entrance surface 102 and located on a side of the first light entrance surface 102 facing away from the light exit surface 101; and a bowl-shaped free curved surface 104 surrounding the second light entrance surface 103 and opposite to the light exit surface 101; the light exit surface 101, the first light entrance surface 102, the second light entrance surface 103 and the bowl-shaped free curved surface 104 enclose the lens 100.

The lens provided by the embodiment of the invention utilizes the first light entrance surface and the second light entrance surface to form a groove, and a light source such as an OLED (as indicated by reference sign 30 in FIG. 1) can be disposed in the groove or in the vicinity of the groove. For a light source such as an OLED, light with a small emission angle can be transmitted through the first light entrance surface and exits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. In applications of display devices such as LCDs and OLEDs, the use of a collimated light beam can control the display orientation of the display device well, thereby not only achieving a better display effect, but also reducing energy consumption and saving maintenance costs.

In certain exemplary embodiments, as shown in FIG. 1, the light exit surface 101 is planar.

Using a planar light exit surface is beneficial for simplifying the design of the first light entrance surface, the second light entrance surface and the bowl-shaped free curved surface. Compared with a light exit surface with a complex shape, the lens provided by the embodiment of the invention can also be implemented by a simple manufacturing process. For example, the light exit surface can be used as a bottom surface, and the lens can be manufactured by a process such as lithography, imprinting, laser ablation, or electron beam direct writing.

However, the light exit surface can also be a curved surface such as a convex surface. In this case, the lens can be formed using an injection molding process; for example, the first light entrance surface, the second light Entrance surface and bowl-shaped free curved surface can be formed first by a process such as lithography, imprinting, laser ablation or electron beam direct writing, and then the light exit surface is formed.

In certain exemplary embodiments, as shown in FIG. 1, the first light entrance surface 102 has a convex surface.

In this embodiment, with a first light entrance surface in the form of a convex lens, light of a small emission angle can be further collimated so that the exit beam has a smaller divergence angle.

Figure 2:
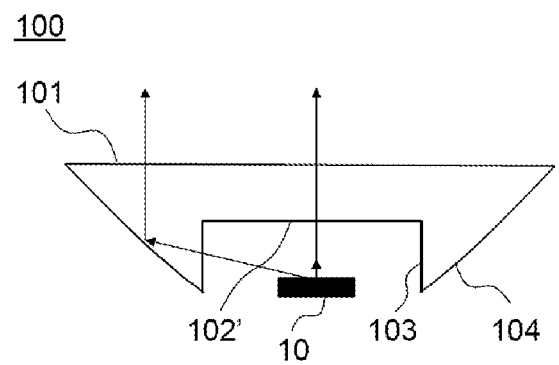
FIG. 2 is a cross section diagram of a lens according to another embodiment of the invention.

For light with a small emission angle, the beam can also be corrected without the use of a curved surface. As shown in FIG. 2, in some embodiments, the first light entrance surface 102' can also have a planar shape.

In order to obtain an ideal bowl-shaped free curved surface and to simplify and optimize the design of the lens, the following method can be used to design the bowl-shaped free curved surface of the lens according to the embodiment of the invention.

Figure 3:
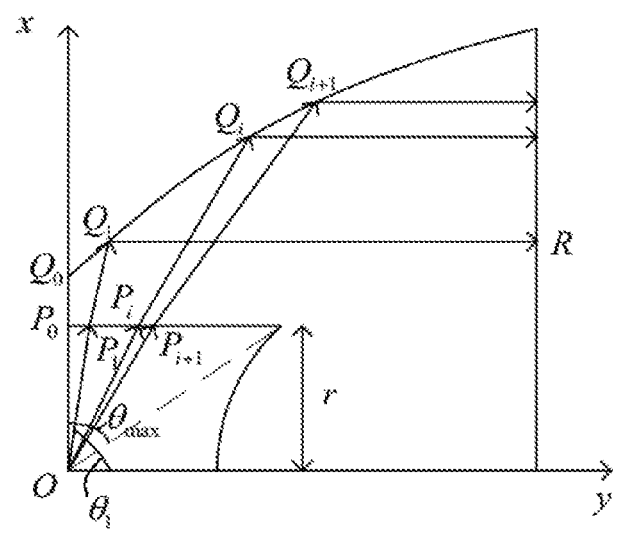
FIG. 3 is a schematic diagram of a design method of a lens according to an embodiment of the invention.

First, the coordinate system shown in FIG. 3 is created. The central axis of the lens is set as the y-axis and the position of light source is set to be the origin of coordinate. The light source is supposed to be an ideal point light source, the light emitted from the origin is firstly refracted into the lens through the surface (x=r) and then transformed into light parallel to the y-axis by total internal reflection at the bowl-shaped free curved surface and exits. $\theta_{max}$ is the beam angle range entering the lens via the second light entrance surface. $\theta_{max}$ can be divided equally into M parts. $\theta_i$ is the angle between the light emitted by the light source and the y-axis, and $\theta_i = 90° - i*\theta_{max}/M$, where i=1, 2, . . . M. $P_0$, $P_1$, . . . , $P_i$ are the intersections of the light beams with the angles of incidence $\theta_0, \theta_1, \ldots, \theta_i$ and the straight line x=r. $Q_0 (x_0, y_0), Q_1 (x_1, y_1), \ldots, Q_i (x_i, y_i)$ are the intersections of the light beams entering the lens and the generatrix of the bowl-shaped free curved surface.

Further, the relationship between $x_1$ and $x_0$ is derived. $P_0(r, 0), Q_0 (x_0, y_0)$ is shown in FIG. 3. $\theta_0$ is the angle between $OP_0$ and the y-axis, which means that $P_0$ (r, r cot $\theta_0$). For $Q_1 (x_1, y_1)$, the unit vector of $OP_1$ is set as $p_1$ and the unit direction vector of $P_1Q_1$ is $q_1$; then from Snell's Law the following equations can be obtained: $n_{q1}-p_1=PN_1$ (Equation 1) and $p_1=(\sin \theta_1, \cos \theta_1)$ (Equation 2). In Equation 1: P is a constant and $N_1$ is a unit normal vector.

From Equation 1 and Equation 2 one can obtain:

$$q_1 = \left(\frac{K_1 + \sin \theta_1}{n}, \frac{\cos \theta_1}{n}\right), \quad \text{(Equation 3)}$$

where $K_1$ is an unknown number. $Q_1R$ is parallel to the y-axis, so its unit normal vector is (0,1). The normal vector at $Q_1$ in the bowl-shaped free curved surface is set as $(N_{x1}, N_{y1})$. According to the principle of total reflection, for the light beams $P_1Q_1$ and $Q_1R_1$, $n(0,1)-q_1=N_1=[-(K_1+\sin \theta_1), n-\cos \theta_1]$ (Equation 4).

$P_1Q_1$ is parallel to $q_1$, then $P_1Q_1=k'q_1$, where k' is a constant. $P_1Q_1=(x_1-r, y_1-r \cos \theta_1)$, therefore $$\frac{x_1 - r}{K_1 + \sin \theta_1} = \frac{y_1 - r \cot \theta_1}{\cos \theta_1}. \quad \text{(Equation 5)}$$

Since $Q_0Q_1$ is perpendicular to $N_1$, there is: $Q_0Q_1 \cdot N_1=0$, that is, $(x_1-x_0) N_{x1}=(y_1-y_0) N_{y1}$ (Equation 6).

According to the law of refraction, the following equation can further be obtained: $K_1=\sqrt{(n^2-\cos^2\theta_1)}-\sin \theta_1$ (Equation 7).

The relationship between $x_1$ and $x_0$ can be obtained from the equations (4) (5) (6) (7), and $(x_1, y_1)$ can be calculated based on $(x_0, y_0)$. Similarly, the recurrence relation of $(x_i, y_i)$ and $(x_{i+1}, y_{i+1})$ can be derived, i.e. the aggregated recurrence relations are:

$$\begin{cases} (x_{i+1} - y_{i+1})N_{xi} + (y_{i+1} - y_i)N_{yi} = 0 \\ \frac{x_i - r}{K_i + \sin \theta_i} = \frac{y_i - r \cot \theta_i}{\cos \theta_i} \\ N_{xi} = -(K_i + \sin \theta_i) \\ N_{yi} = n - \cos \theta_i \\ K_i = \sqrt{n^2 - \cos^2 \theta_i} - \sin \theta_i \end{cases}$$

Thus, in certain exemplary embodiments, the shape of the bowl-shaped free curved surface is determined by the above recurrence relations; where $(x_i, y_i)$ and $(N_{xi}, N_{yi})$ are respectively coordinates of a point on the bowl-shaped free curved surface corresponding to a light beam with an incident angle $\theta_i$ and a normal vector at the point; r is a distance between the second light entrance surface and an origin; and n is the refractive index of a material of the lens; $P_i$ is coordinates of a intersection point of the light beam with the angle of incidence $\theta_i$ and a straight line x=r; and $K_i=\sqrt{n^2\cos^2\theta_i}-\sin \theta_i$.

According to the above recurrence relations of $(x_i, y_i)$ and $(x_{i+1}, y_{i+1})$, the design of the lens can be simplified and optimized. Different N values can be used to obtain bowl-shaped free curved surfaces and collimation effects with different accuracies.

Figure 4:
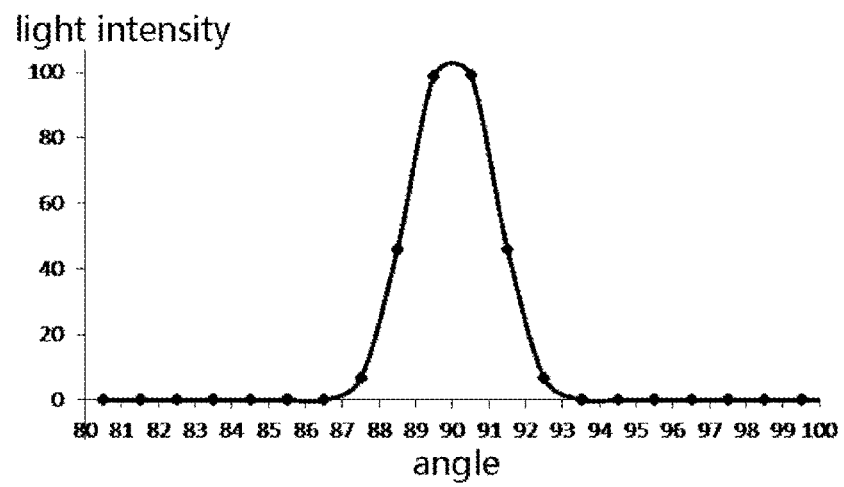
FIG. 4 is a schematic diagram of a collimation effect of a lens according to an embodiment of the invention.

Let r=50 μm, $\theta_{max}$=60° and M=3000; the lens can be made with PMMA (n=1.4935). The above model of bowl-shaped free curved surface is imported into software such as lighttools for simulation, and a collimated light beam with a collimation range of −2°~+2° can be obtained. FIG. 4 is a schematic diagram of a collimation effect of a lens according to an embodiment of the invention, in which the abscissa represents the angle range of the light intensity distribution and the ordinate represents the normalized light intensity.

In certain exemplary embodiments, a material of the lens is a transparent organic material.

For example, a transparent polymer material such as PMMA, resin, etc. can be used to manufacture the lens of the embodiment of the invention.

Figure 5:
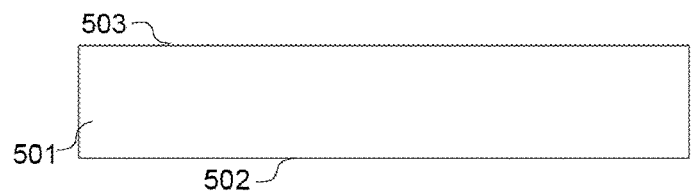
FIGS. 5(a)-5(b) are schematic diagrams of a method for manufacturing a lens according to an embodiment of the invention.
Figure 5:
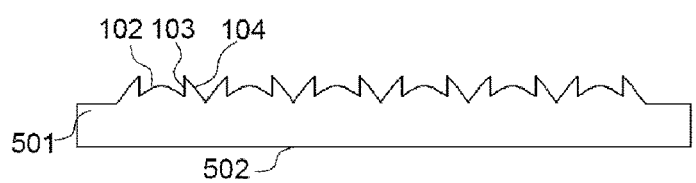

According to another aspect of the invention, an embodiment of the invention provides a method for manufacturing the lens described in the above embodiment. The method includes the following steps: providing a substrate 501, the substrate 501 including a first substrate surface 502 and a second substrate surface 503 opposite to the first substrate surface 502, as shown in FIG. 5(a); disposing the first substrate surface 502 as the light exit surface; forming the first light entrance surface 102, the second light entrance surface 103, and the bowl-shaped free curved surface 104 on the second substrate surface by at least one process of lithography, imprinting, laser ablation and electron beam direct writing, as shown in FIG. 5(b).

The first light entrance surface, the second light entrance surface, and the bowl-shaped free curved surface can be formed on the second substrate surface by a process of lithography, imprinting, laser ablation or electron beam direct writing, a part of the substrate is thus formed as the lens. With such a process, lenses or array of lenses as described in embodiments of the invention can be conveniently formed directly on the substrate.

Figure 6:
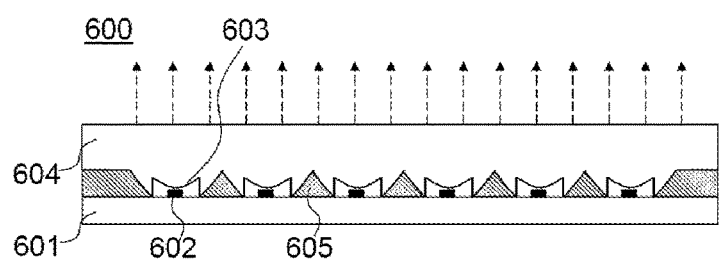
FIG. 6 is a cross section diagram of a backlight panel according to an embodiment of the invention.

According to yet another aspect of the invention, an embodiment of the invention provides a backlight panel. FIG. 6 is a cross section diagram of a backlight panel according to an embodiment of the invention; the backlight panel 600 includes: a light source substrate 601; a plurality of light sources 602 disposed on the light source substrate 601; and a plurality of lenses 603 as described in the above embodiments. Each of the lenses 603 corresponds to one of the plurality of light sources 602.

The lens provided by the embodiment of the invention utilizes the first light entrance surface and the second light entrance surface to form a groove, and a light source such as an OLED can be disposed in the groove or in the vicinity of the groove. For a light source such as an OLED, light with a small emission angle can be transmitted through the first light entrance surface and exits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. Furthermore, arranging the plurality of light sources on the light source substrate can conveniently form modular structures that adapt to various display devices or lighting devices.

In certain exemplary embodiments, as shown in FIG. 6, the backlight panel 600 further includes a substrate 604, and the plurality of lenses 603 are integrally formed on the substrate 604.

The first light entrance surface, the second light entrance surface, and the bowl-shaped free curved surface can be formed on one surface of the substrate by a process of lithography, imprinting, laser ablation or electron beam direct writing, a part of the substrate is thus formed as the lens. With such a process, lenses or array of lenses as described in embodiments of the invention can be conveniently formed directly on the substrate.

In certain exemplary embodiments, as shown in FIG. 6, the backlight panel 600 further includes a filling material 605 disposed between the plurality of lenses 603; the refractive index of the filling material 605 is lower than the refractive index of the lens 603.

By applying a filling material with a lower refractive index, it can be ensured that light with a large emission angle realizes total internal reflection on the bowl-shaped free curved surface, thereby further increasing the utilization ratio of light.

Figure 7:
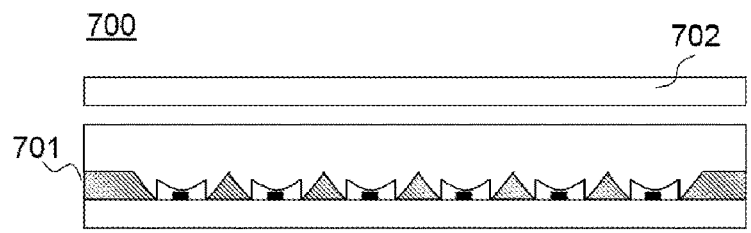
FIG. 7 is a schematic diagram of a display device according to an embodiment of the invention.

According to still another aspect of the invention, an embodiment of the invention provides a display device. FIG. 7 is a schematic diagram of a display device according to an embodiment of the invention. The display device 700 includes a backlight panel 701 as described in the above embodiments and a liquid crystal display panel 702 disposed on a light exit side of the backlight panel 701. The display device may be any product or component with a display function, such as a mobile phone, a tablet computer, a television, a display, a notebook computer, a digital photo frame, a navigator, etc.

The lens provided by the embodiment of the present invention utilizes the first light entrance surface and the second light entrance surface to form a groove, and a light source such as an OLED can be disposed in the groove or in the vicinity of the groove. For a light source such as an OLED, light with a small emission angle can be transmitted through the first light entrance surface and emits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. In applications of display devices such as LCDs and OLEDs, the use of a collimated light beam can control the display orientation of the display device well, thereby not only achieving a better display effect, but also reducing energy consumption and saving maintenance costs.

Figure 8:
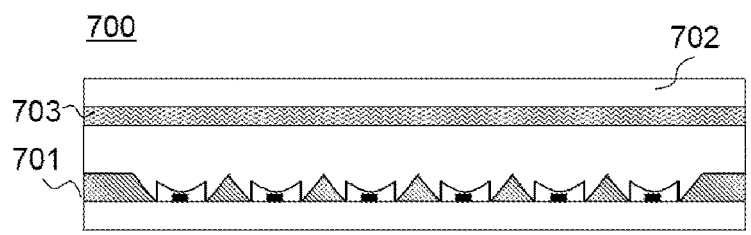
FIG. 8 is a schematic diagram of a display device according to another embodiment of the invention.
Figure 9:
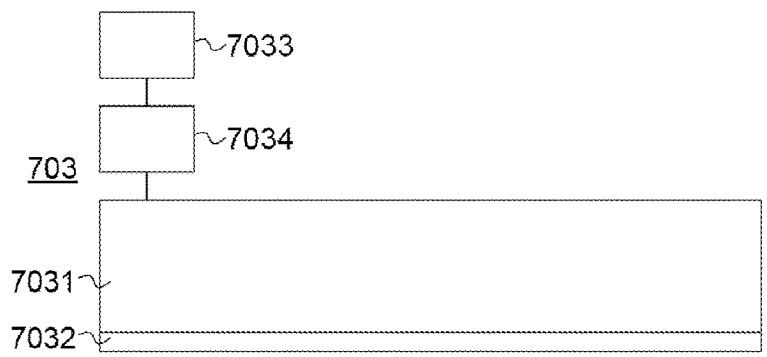
FIG. 9 is a schematic diagram of a light control panel according to an embodiment of the invention.

FIG. 8 is a schematic diagram of a display device according to another embodiment of the invention. In certain exemplary embodiments, the display device 700 further includes a light control panel 703 disposed between the backlight panel 701 and the liquid crystal display panel 702. FIG. 9 is a schematic diagram of a light control panel according to an embodiment of the invention. The light control panel 703 includes: a controllable liquid crystal lens 7031; a first polarizer 7032 located on a light entrance side of the controllable liquid crystal lens 7031; a determining unit 7033 for determining a light exit direction of the light control panel 703; and a control unit 7034 for controlling a liquid crystal tilt angle of the controllable liquid crystal lens 7031 based on the light exit direction determined by the determining unit 7033, thereby redirecting light into the determined light exit direction.

The light control panel of the embodiment of the invention can change the tilt angle of the liquid crystal of the liquid crystal layer, e.g. in a voltage control mode, and cooperate with the polarizer to redirect the light beam into the direction determined by the light control panel.

In the context of the invention, each "unit" and "module" in the embodiments can be implemented by a combination of a computer or a combination of a computer and a suitable sensor. The processing procedure of each unit and module can be performed, for example, by a processor in the computer.

The determining unit 7034 can include elements such as a camera, a position sensor or a displacement sensor.

Figure 10:
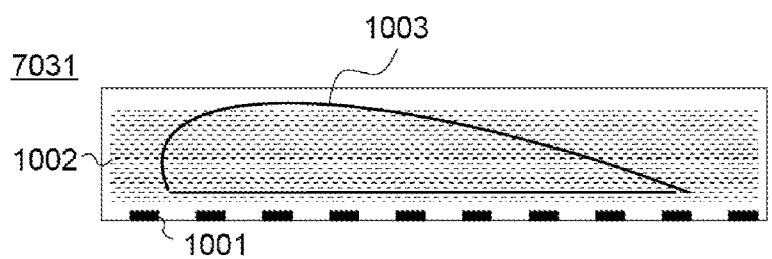
FIG. 10 is a schematic diagram of a controllable liquid crystal lens according to an embodiment of the invention.

In certain exemplary embodiments, the control unit adjusts the electric field in one or more subregions in each region of the controllable liquid crystal lens based on the determined light exit direction, thereby adjusting the tilt angle of the liquid crystal in the subregions. The controlling of the controllable liquid crystal lens 7031 is shown in FIG. 10, under the control of the electrode 1001, the liquid crystal layer 1002 in different regions with liquid crystal molecules of different tilt angles are arranged in a focusing manner to form an equivalent liquid crystal lens 1003.

Figure 11:
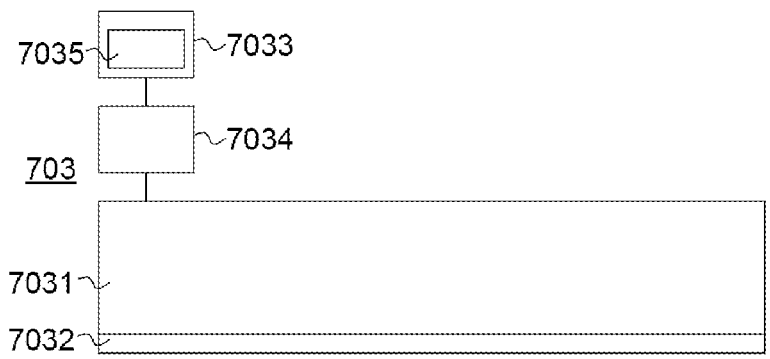
FIG. 11 is a schematic diagram of a light control panel according to another embodiment of the invention.

In certain exemplary embodiments, as shown in FIG. 11, the determining unit 7033 further includes a user location collecting module 7035 for collecting current location information of a user. The determining unit 7033 determines the light exit direction of the light control panel 703 based on the current location information of the user collected by the user location collecting module 7035.

When the position of the user in front of the light control panel changes, e.g. from directly in front of the light control panel to the left front of the light control panel, the image sensing unit of the light control panel such as the camera senses the position change of the user and collects the location information after the user moves, for example, the image sensing unit of the light control panel collects the location information of the user's eye and transmits the location information to the processing unit of the light control panel, so that the processing unit determines the light exit direction of the light control panel.

Figure 12:
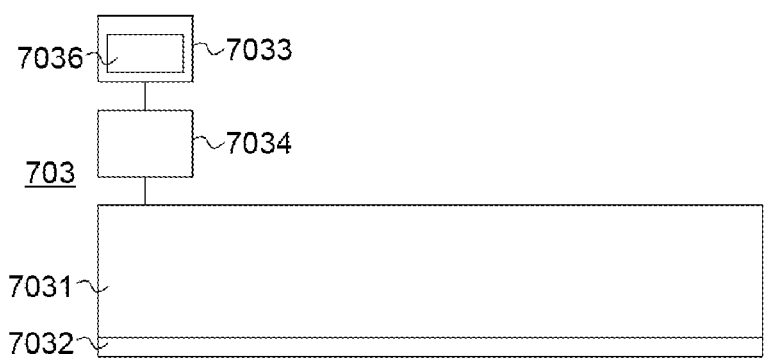
FIG. 12 is a schematic diagram of a light control panel according to yet another embodiment of the invention.

In certain exemplary embodiments, as shown in FIG. 12, the determining unit 7033 further includes a light intensity collecting module 7036 for collecting light intensity information of ambient environment. The determining unit 7033 determines the light exit direction of the light control panel 703 based on the light intensity information collected by the light intensity collecting module 7036.

When the ambient light intensity of the light control panel changes e.g. from large to small (i.e., the brightness decreases), the light sensing unit of the light control panel, such as a light intensity sensor or a brightness sensor, senses the current ambient change and collects light information of darkening, and then sends the information to the processing unit of the light control panel so that the processing unit determines the direction of the light path after passing through the liquid crystal lens. The light beam is more divergent after the light beam passes through the light control panel, thereby reducing the visual brightness. In addition, if the light intensity changes from small to large (i.e., the brightness increases), the light sensing unit senses the current ambient changes and collects light information of brightening, and then sends the information to the processing unit of light control panel so that the processing unit determines the light exit direction of the light control panel.

The embodiments of the invention provide a lens and a manufacturing method thereof, a backlight panel and a display device, which improve the collimation of the light beam emitted from the light source and improve the utilization ratio of light energy. The lens provided by the embodiment of the invention utilizes the first light entrance surface and the second light entrance surface to form a groove, and a light source such as an OLED can be disposed in the groove or in the vicinity of the groove. For a light source such as an OLED, light with a small emission angle can be transmitted through the first light entrance surface and exits through the light exit surface. Light with a large emission angle enters the lens from the second light entrance surface, realizes total internal reflection on the bowl-shaped free curved surface and exits through the light exit surface. As a result, the collimation of the light beam emitted from the light source is enhanced and the utilization ratio of light energy is improved. In applications of display devices such as LCDs and OLEDs, the use of a collimated light beam can control the display orientation of the display device well, thereby not only achieving a better display effect, but also reducing energy consumption and saving maintenance costs.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:
1. A lens, comprising:
a light exit surface;
a first light entrance surface opposite to the light exit surface;
a second light entrance surface surrounding the first light entrance surface and located on a side of the first light entrance surface facing away from the light exit surface; and
a bowl-shaped freeform curved surface surrounding the second light entrance surface and opposite to the light exit surface; the light exit surface, the first light entrance surface, the second light entrance surface and the bowl-shaped freeform curved surface enclose the lens,
wherein a shape of the bowl-shaped freeform curved surface is determined by the recurrence relations

$$\begin{cases} (x_{i+1} - y_{i+1})N_{xi} + (y_{i+1} - y_i)N_{yi} = 0 \\ \dfrac{x_i - r}{K_i + \sin \theta_i} = \dfrac{y_i - r \cot \theta_i}{\cos \theta_i} \\ N_{x_i} = -(K_i + \sin \theta_i) \\ N_{y_i} = n - \cos \theta_i \\ K_i = \sqrt{n^2 - \cos^2 \theta_i} - \sin \theta_i \end{cases} ;$$

where $(x_i, y_i)$ and $(N_{xi}, N_{yi})$ are respectively coordinates of a point on the bowl-shaped freeform curved surface corresponding to a light beam with an incident angle θ, and a normal vector at the point; r is a distance between the second light entrance surface and an origin; and n is a refractive index of a material of the lens.

2. The lens according to claim 1, wherein the light exit surface is planar.

3. The lens according to claim 1, wherein the first light entrance surface has a convex surface.

4. The lens according to claim 1, wherein a material of the lens is a transparent organic material.

5. A backlight panel, comprising:
a light source substrate;
a plurality of light sources disposed on the light source substrate; and
a plurality of lenses; wherein each of the lenses corresponds to one of the plurality of light sources;
wherein each lens comprises:
a light exit surface;
a first light entrance surface opposite to the light exit surface;
a second light entrance surface surrounding the first light entrance surface and located on a side of the first light entrance surface facing away from the light exit surface; and
a bowl-shaped freeform curved surface surrounding the second light entrance surface and opposite to the light exit surface; the light exit surface, the first light entrance surface, the second light entrance surface and the bowl-shaped freeform curved surface enclose the lens,
wherein a shape of the bowl-shaped freeform curved surface is determined by the recurrence relations $$\begin{cases} (x_{i+1} - y_{i+1})N_{xi} + (y_{i+1} - y_i)N_{yi} = 0 \\ \dfrac{x_i - r}{K_i + \sin \theta_i} = \dfrac{y_i - r \cot \theta_i}{\cos \theta_i} \\ N_{x_i} = -(K_i + \sin \theta_i) \\ N_{y_i} = n - \cos \theta_i \\ K_i = \sqrt{n^2 - \cos^2 \theta_i} - \sin \theta_i \end{cases} ;$$

where $(x_i, y_i)$ and $(N_{xi}, N_{yi})$ are respectively coordinates of a point on the bowl-shaped freeform curved surface corresponding to a light beam with an incident angle θ, and a normal vector at the point; r is a distance between the second light entrance surface and an origin; and n is a refractive index of a material of the lens.

6. The backlight panel according to claim 5, further comprising a basis substrate; wherein the plurality of lenses are integrally formed on the basis substrate.

7. The backlight panel according to claim 5, further comprising a filling material disposed between the plurality of lenses; wherein the refractive index of the filling material is lower than the refractive index of the lens.

8. The backlight panel according to claim 5, wherein the light exit surface is planar.

9. The backlight panel according to claim 5, wherein the first light entrance surface has a convex surface.

10. The backlight panel according to claim 5, wherein a material of the lens is a transparent organic material.

11. A display device, comprising the backlight panel according to claim 5 and a liquid crystal display panel disposed on a light exit side of the backlight panel.

12. The display device according to claim 11, wherein the light exit surface is planar.

13. The display device according to claim 11, further comprising a light control panel disposed between the backlight panel and the liquid crystal display panel; wherein the light control panel comprises: a controllable liquid crystal lens; a first polarizer located on a light entrance side of the controllable liquid crystal lens; a determining unit for determining a light exit direction of the light control panel; and a control unit configured to adjust an electric field in one or more subregions in each region of the controllable liquid crystal lens, thereby adjusting a tilt angle of liquid crystal in the subregions.

14. The display device according to claim 13, wherein the determining unit further comprises:
   a user location collecting module for collecting current location information of a user.

15. The display device according to claim 13, wherein the determining unit further comprises:
   a light intensity collecting module for collecting light intensity information of ambient environment.

* * * * *